United States Patent [19]

Ando et al.

[11] Patent Number: 5,011,960
[45] Date of Patent: Apr. 30, 1991

[54] WIRING PATTERN DETECTION METHOD AND APPARATUS

[75] Inventors: Moritoshi Ando; Hiroshi Oka; Satoshi Iwata, all of Atsugi, Japan

[73] Assignee: Fujitsu Limited, Kawasaki, Japan

[21] Appl. No.: 349,270

[22] Filed: May 9, 1989

[30] Foreign Application Priority Data

May 20, 1988 [JP] Japan .................................. 63-124118
Jul. 28, 1988 [JP] Japan .................................. 63-188918

[51] Int. Cl.⁵ ...................... G01B 11/24; G01N 21/00
[52] U.S. Cl. ..................................... 356/376; 356/237; 356/398
[58] Field of Search .............. 356/1, 375-378, 356/372, 377, 388, 386, 387, 388, 390, 392, 394, 398, 237; 250/560, 561, 237 G

[56] References Cited

U.S. PATENT DOCUMENTS

| | | | |
|---|---|---|---|
| 4,349,277 | 9/1982 | Mundy et al. | 356/1 |
| 4,472,056 | 9/1984 | Nakagawa et al. | 356/376 |
| 4,650,333 | 3/1987 | Crabb et al. | 356/376 |
| 4,674,869 | 6/1987 | Pryor et al. | 356/1 |
| 4,796,997 | 1/1989 | Svetkoff et al. | |

FOREIGN PATENT DOCUMENTS 0160781 11/1985 European Pat. Off. .
0248479 12/1987 European Pat. Off. .
2453392 10/1980 France .

OTHER PUBLICATIONS

European Search Report, Appln. No. EP 89 30 4795, Berlin, Oct. 6, 1989, Examiner Vorropoulos, G.

Primary Examiner—Richard A. Rosenberger
Assistant Examiner—Hoa Pham
Attorney, Agent, or Firm—Staas & Halsey

[57] ABSTRACT

A method of detection of a wiring pattern using triangulation to detect a height thereof, comprising the steps of scanning a light beam from a light source, illuminating the wiring pattern to be detected by the scanned light beam, focusing the light reflected from the wiring pattern or a substrate, applying the focused light beam to a beam-splitter, and converting a wiring pattern configuration to a corresponding electric signal. Further, by blurring the focused light entering the beam-splitter, an expansion of a measurable height domain of the wiring pattern is possible. Furthermore, by applying a correction factor in response to the height of the substrate, the detected output of the wiring pattern height for a curved substrate can be sliced with a more appropriate slice level. Further, the beam-splitter comprises a reflection portion, a half reflection and half transmission portion, and a transmission portion. The width of the half reflection and half transmission portion is such that an upper and lower threshold value of the height of the wiring pattern can be determined, and thus the allowable limits of the wiring pattern height can be more accurately detected.

16 Claims, 14 Drawing Sheets

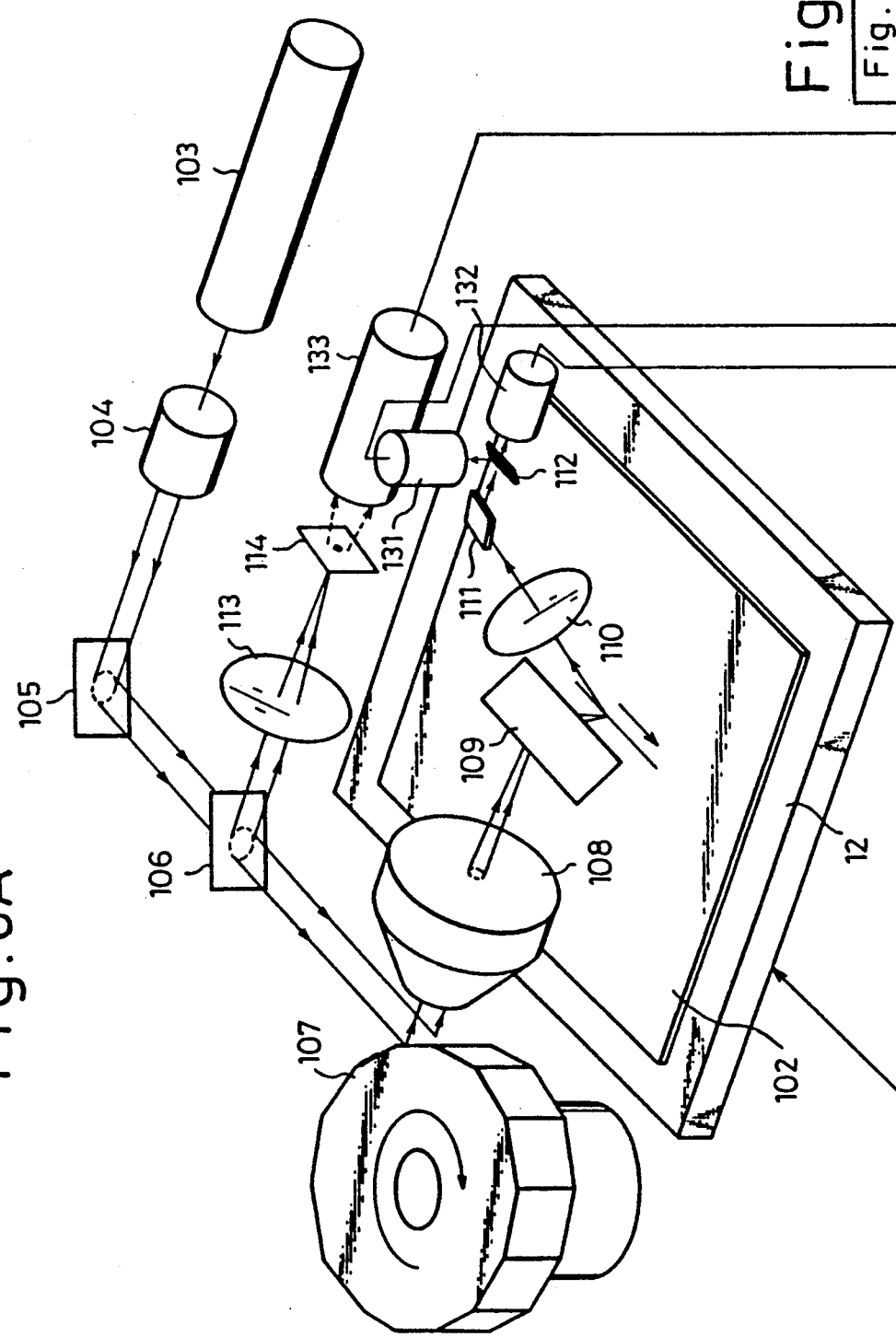

WIRING PATTERN DETECTION METHOD AND APPARATUS

BACKGROUND OF THE INVENTION

(1) Field of the Invention

The present invention relates to a detection method and apparatus for a wiring pattern using a triangulation method in which a light is obliquely incident on an object and a measurement is made from another oblique direction, to detect a height of the wiring pattern, and more particularly, it relates to a detection method and apparatus for a wiring pattern for expanding a wiring pattern height measurable domain and by which a pattern having a height between an upper allowable limit and a lower allowable limit thereof can be accurately determined.

(2) Description of the Related Art

Generally, a wiring pattern on a printed circuit board has a predetermined pattern width and height (thickness) conforming to a required design, but sometimes a failure occurs such as a pattern disconnection, partial defect and the like due to various factors in the production processes. Among the failures occurring in a wiring pattern, for example, a copper film having a three dimensional configuration, are the defects of an abnormal width and an insufficient thickness of the copper film. With regard to the thickness defect, upper and lower limits thereof are defined, and the thickness of the wiring pattern must be within these allowable limits. Conventionally, however, the pattern is examined only to a narrow extent, to determine whether it is within a predetermined height.

Accordingly, in the conventional method of detection of a wiring pattern, since the thickness of the wiring pattern is only determined to be higher or lower in comparison with a threshold value (a predetermined height), a problem arises in that the conventional method cannot accurately determine an area within the allowable extent of the upper and lower limits of the wiring pattern thickness.

Further, in the conventional method of detection of a wiring pattern, when the slice level value is set as a threshold value, since the slice level voltage is determined by adding a constant voltage to the voltage corresponding to the surface of a substrate on which the wiring pattern is formed, in the case of a curved substrate, for example, the relationship between the slice level voltage and the detection signal is often unsuitable.

SUMMARY OF THE INVENTION

A primary object of the present invention is to provide a detection method and apparatus for a wiring pattern wherein the measuring domain of the height of the wiring pattern is considerably expanded.

Another object of the present invention is to provide a detection method and apparatus for a wiring pattern capable of accurately determining patterns within an allowable extent between upper and lower limits in the pattern thickness.

A further object of the present invention is to provide a detection method and apparatus for a wiring pattern wherein a slice level for the detection signal is more appropriately determined, and thus even when the substrate is curved, the sectional configuration of the wiring pattern on the substrate is expressed accurately as a pattern.

According to the present invention, there is provided a method of detection of a wiring pattern using a triangulation method to detect a height thereof. The method comprises the steps of illuminating a wiring pattern to be detected on a substrate by the scanned light beam from a light source; blur-focusing light reflected from the wiring pattern and the substrate through a focusing lens at a position in response to a configuration of the wiring pattern; separating the blur-focused reflected light into reflected light and transmitted light, each light having a different direction, through a beam-splitter at a rate in response to parts of the beam-splitter, entered by the blur-focused reflected light; detecting the separated reflected light and transmitted light using optical sensors, respectively; measuring a difference of quantities of the reflected light and the transmitted light; and determining from the measured difference an upper threshold value and a lower threshold value relative to a height of the wiring pattern.

Further, the present invention provides a method of detection of a wiring pattern using a triangulation method to detect a height thereof. The method comprises the steps of scanning a light beam from a light source through a rotating polygon mirror and a scanning lens; illuminating a wiring pattern to be detected on a substrate by the scanned light beam; focusing the light beam reflected from the wiring pattern and the substrate through a focusing lens at a position corresponding to a configuration of the wiring pattern; separating the focused reflected light beam into reflected light and transmitted light each having a different direction, through a beam-splitter having a substantially complete reflection portion, a medium reflection and medium transmission portion, and a substantially complete transmission portion, at a rate in response to parts of the beam-splitter, on which the focused reflected light is incident; detecting the two separated lights, respectively, using optical sensors; measuring a difference of quantities of the two lights; and determining from the measured difference an upper threshold value and a lower threshold value, relative to a height of the wiring pattern, as values corresponding to a width of an area having a medium reflectivity in the beam-splitter.

Further, the present invention provides a detection apparatus for a wiring pattern using a triangulation method to detect a height thereof. The apparatus comprises a focusing lens receiving a light beam reflected from a wiring pattern and a substrate thereof, which are illuminated by a scanned light beam, and for blur-focusing the reflected light beam; a beam-splitter receiving the light beam from the focusing lens, and for outputting a reflected light beam and a transmitted light beam separately, the quantities of which correspond to an incident light beam position which corresponds to a configuration of the wiring pattern; two optical sensors for receiving the reflected light beam and the transmitted light beam, respectively, from the beam-splitter; and a differential amplifier for determining the difference between outputs of the two optical sensors, to obtain upper and lower threshold values corresponding to upper and lower allowable limits of the wiring pattern height.

Further, the present invention provides a detection apparatus for a wiring pattern using a triangulation method to detect a height thereof. The apparatus comprises a light source for projecting a light beam; a rotating polygon mirror and a scanning lens for scanning the light beam on the wiring pattern; a focusing lens receiving a light beam reflected from the wiring pattern and a substrate thereof, and for focusing the reflected light beam; a beam-splitter having three areas, one of which reflects an incident light beam, another of which reflects substantially half and transmits substantially half, and the other of which transmits the incident light beam, for receiving the light beam from the focusing lens, and for outputting a reflected light beam and a transmitted light beam separately, the quantities of which correspond to an incident light beam position which corresponds to a configuration of the wiring pattern; two optical sensors for receiving the reflected light beam, and the transmitted light beam, respectively, from the beam-splitter; a differential amplifier for determining the difference between outputs of the two optical sensors, to obtain upper and lower threshold values corresponding to upper and lower allowable limits of the wiring pattern height; and the width of the area of the beam-splitter which reflects substantially half and transmits substantially half the light beam corresponds to a dimension between the upper and lower limits of the wiring pattern height.

Other features and advantages of the invention will be apparent from the following description given with reference to the accompanying drawings.

BRIEF DESCRIPTION OF THE DRAWINGS

FIGS. 6A and 6B are a perspective view of the apparatus and a block circuit diagram connected thereto to which the present invention is applied;

DESCRIPTION OF THE PREFERRED EMBODIMENTS

Prior to an explanation of the preferred embodiments of the present invention, the related arts are explained with reference to the accompanying drawings.

Figure 1:
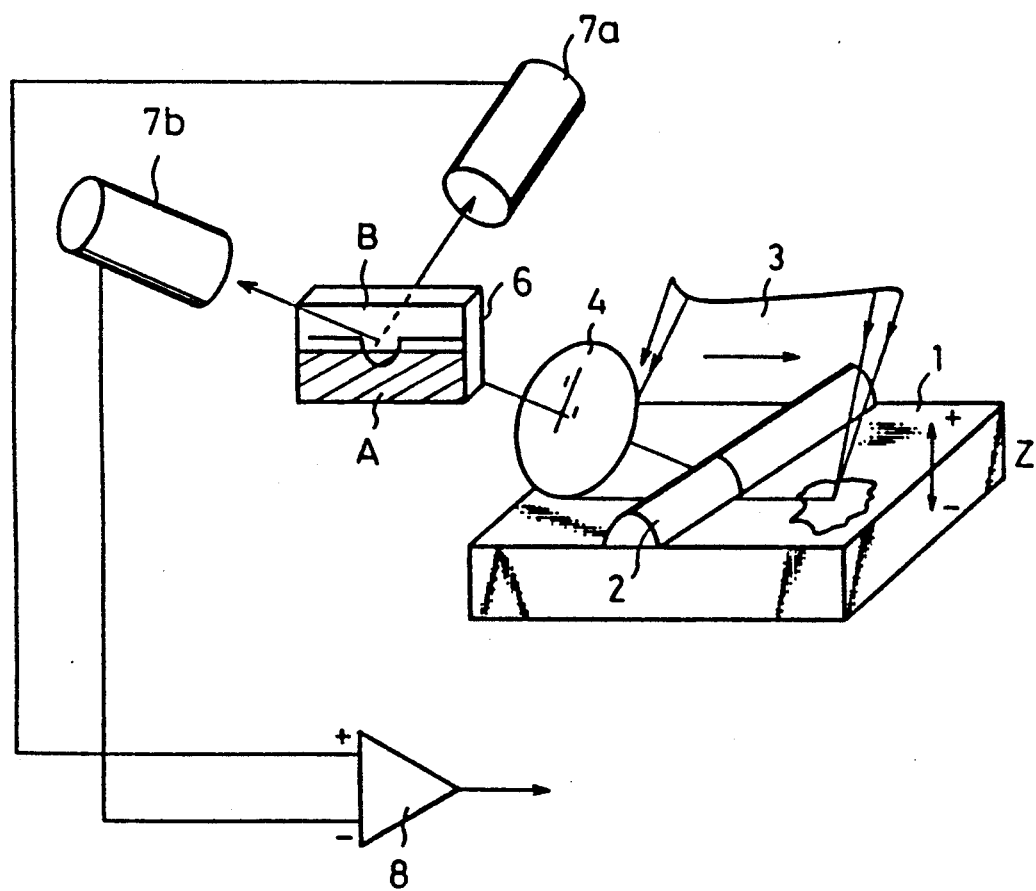
FIG. 1 is a perspective view of a conventional detection apparatus for a wiring pattern.
Figure 2:
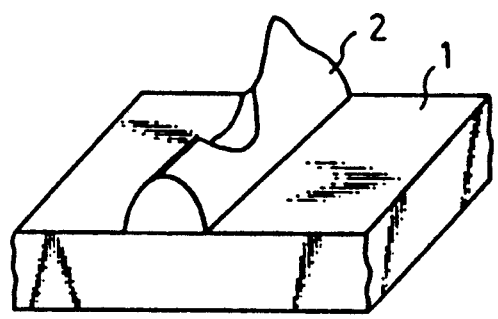
FIG. 2 is a perspective view of a wiring pattern on a substrate.
Figure 3:
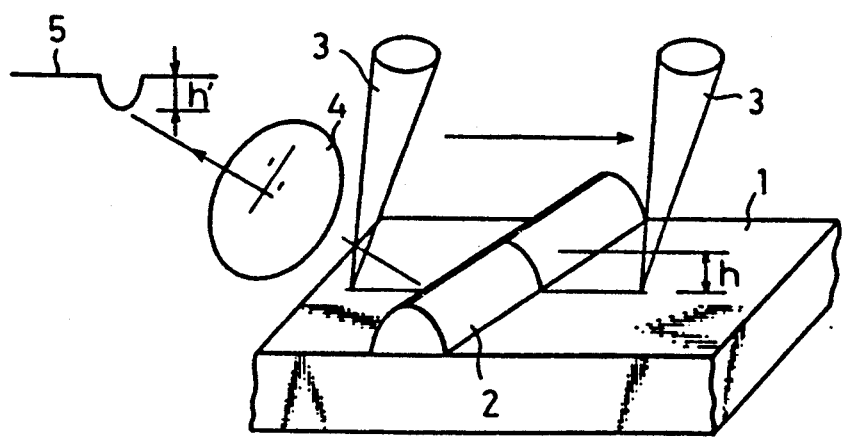
FIG. 3 is a perspective view explaining a conventional method of detection using triangulation.

FIG. 1 is a perspective view of an example of a constitution of an apparatus used in a conventional method of a detection of a wiring pattern, FIG. 2 is a perspective view of an example of a wiring pattern on a substrate, and FIG. 3 is a diagram explaining the conventional method.

In these figures, 1 is a substrate, 2 is a wiring pattern of, for example, copper paste, 3 is a light beam, for example, irradiated from a laser, 4 is a focusing lens, 5 is an image focused through the focusing lens 4, 6 is a beam-splitter having two areas each with different reflectivities, and used for separating the light, 7a and 7b are optical sensors, and 8 is a differential amplifier. An object to be detected comprises a wiring pattern 2 and a substrate 1.

The above method of detection of a wiring pattern is explained as follows.

First, as shown in FIG. 3, the light beam 3 is scanned at an oblique angle to the object, and the image 5 of the wiring pattern 2 is observed through the focusing lens 4 from another angle. This is known as the triangulation method. If a height of the wiring pattern 2 is h, a displacement of h' appears on the image 5, and to observe the displacement h', the beam-splitter 6 is arranged on the same focusing plane as that on which the focusing lens 4 is focused, as shown in FIG. 1, and the image 5 is divided. The beam-splitter 6 comprises a lower half portion A which provides a 100% reflection of the light beam and an upper half portion B which provides a 100% transmission of the light beam. The light divided by the beam-splitter 6 is detected by the optical sensors 7a and 7b and a differential output thereof is detected through the differential amplifier 8, and as a result, it is determined whether the thickness of the wiring pattern 2 is larger than a threshold value (a predetermined constant height) or smaller than the threshold value. The optical sensor 7b detects the light transmitted from the beam-splitter 6 and the optical sensor 7a detects the light reflected by the beam-splitter 6.

Figure 4:
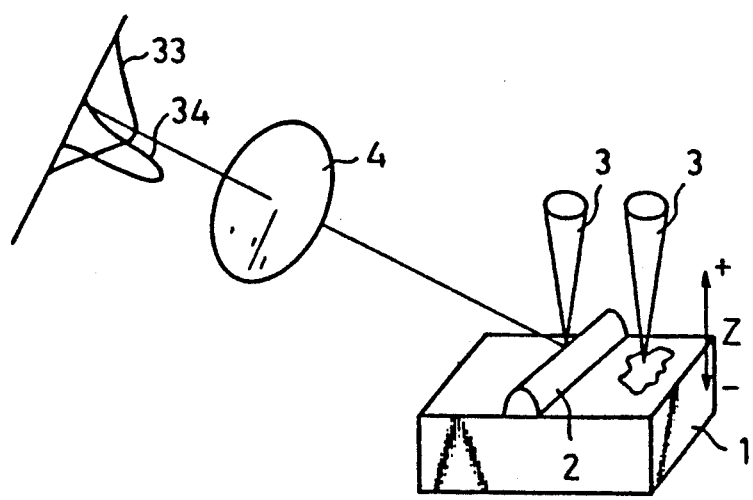
FIG. 4 is a perspective view explaining a problem of a conventional method.
Figure 5:
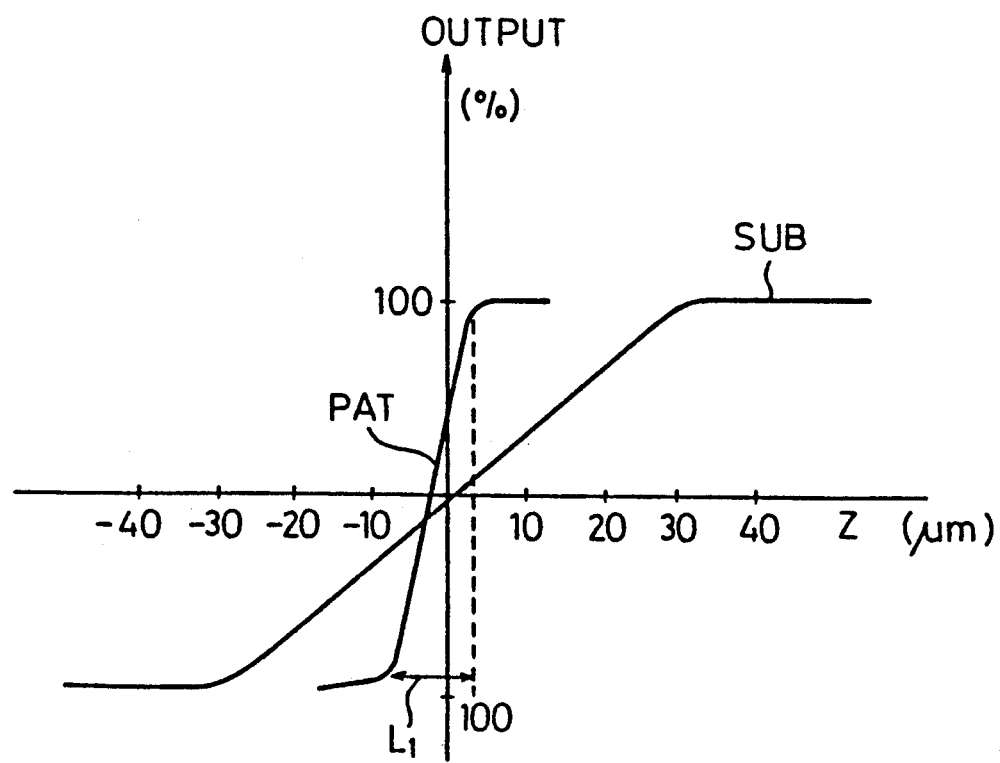
FIG. 5 is a graph explaining a problem of a conventional method.

In addition, as shown in FIG. 4, the light beam 3 is expanded when incident on the substrate, and thus the image in the sensor becomes a large image 33. On the other hand, the light incident on the wiring pattern 2 is not expanded and is detected as a small spot image (image 34). In this case, if the detection of the height of the light beam 3 is made by using the beam-splitter 6, a characteristic as shown in FIG. 5 is obtained; namely, a problem arises in that it is very difficult to detect the height of the wiring pattern 2, i.e., the measurable domain in response to the change of the height is very small as shown by $L_1$ in FIG. 5, and thus an accurate detection is not possible. In FIG. 5, the abscissa shows the height Z of the object and the detection characteristic is shown when the object is moved in direction of the height Z from minus (−) to plus (+), as shown in FIG. 4. The ordinate shows the output of the differential amplifier 8. In FIG. 5, PAT. is a wiring pattern and SUB. is a substrate.

Figure 6B:
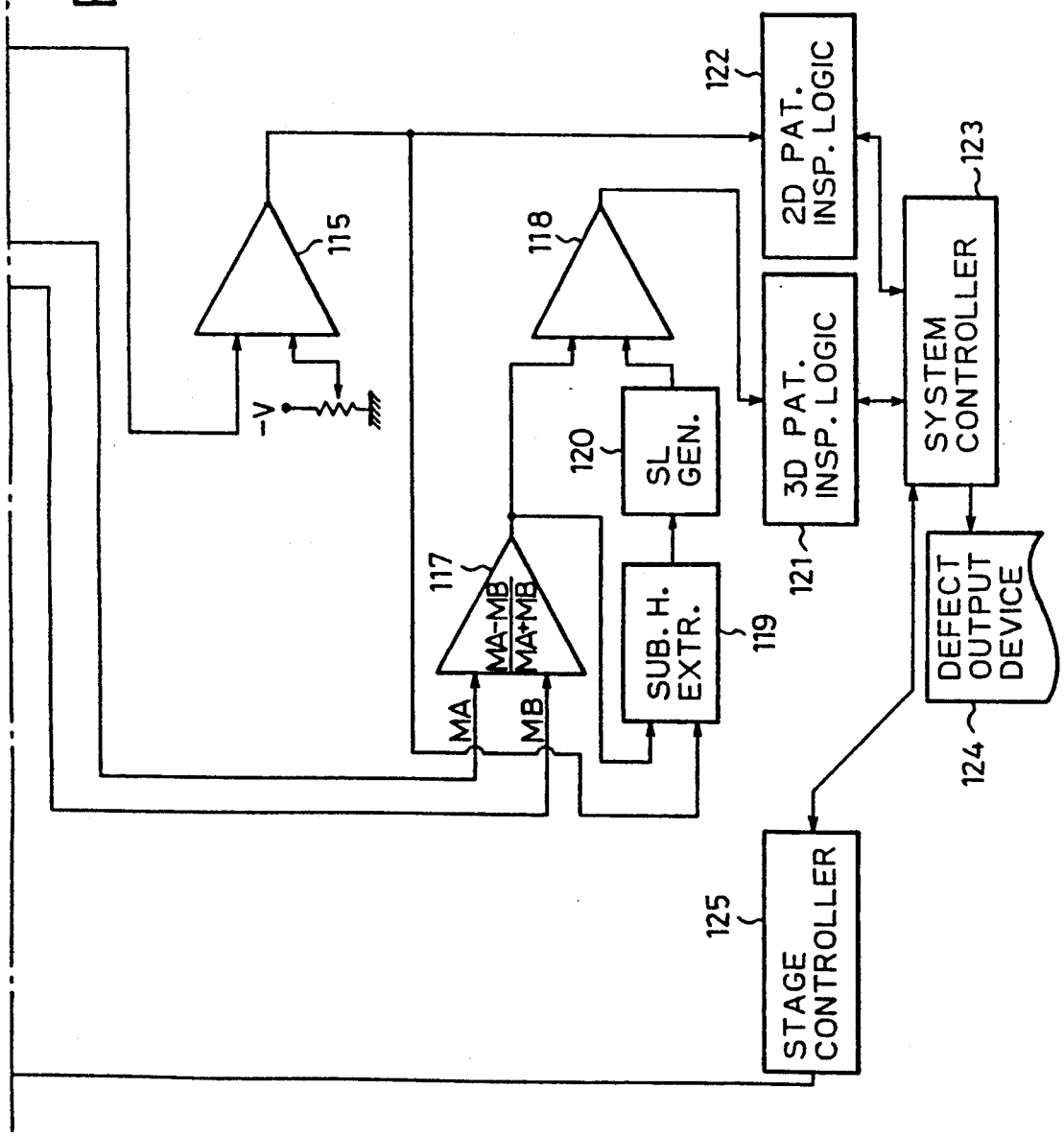

An example of an apparatus to which the present invention is applied is now explained with reference to FIG. 6A and FIG. 6B.

In the apparatus, a laser light from a laser light source 103 is expanded through a beam-expander 104 and the expanded light is scanned by a rotating polygon mirror 107. The scanned laser light is focused as a spot through a scanning lens 108 and is scanned on an object 102 to be detected, in the direction of an arrow in FIG. 6A. The light reflected from the object to be detected is returned along a path which is reverse to that of the incident light, and the reflected light component is then separated by a beam-splitter 106 located between the polygon mirror 107 and the beam-expander 104. The separated reflected light is again focused through a refocusing lens 113 and detected by an optical sensor, e.g., photomultiplier 133, through a space filter 114 located on a refocus plane. Note, 105, 109, and 111 are mirrors, and 12 is a stage on which the object is mounted.

The scanned light is focused in a direction oblique to the direction of the laser incident light, through a scanned light focusing lens 110. Then the moving scanned light spot (image) is divided into two components (images) by an image splitter 112 located at a position apart by a defocusing distance from the focus plane, and each image is detected by photomultipliers 131 and 132 as an integration value of the light thereof.

The two dimensional pattern detection signal, which is an output of the photomultiplier 133, is given two-values by an appropriate slice level through a two-dimensional pattern two-value circuit 115. Note, instead of the two-values, multi-values may be given. The two-valued two-dimensional pattern signal is applied to a two-dimensional pattern inspection logical circuit (2D PAT. INSP. LOGIC) 122 and a detection of defects of the wiring pattern is carried out.

The output of the photomultiplier 131 and the output of the photomultiplier 132 are supplied to a height calculation circuit 117, and the height is calculated. A three-dimensional pattern detection signal, which is an output of the height calculation circuit 117, is given two-values by an appropriate slice level through a three-dimensional pattern two-value circuit 118. Also, in this case, instead of two-values, multi-values may be given. The slice level is generated in a slice level generation circuit (SL GEN.) 120 by an addition of a substrate height signal extracted from the above three-dimensional pattern detection signal, which is extracted by a substrate height extraction circuit (SUB. H. EXTR.) 119, to a signal which corresponds to a predetermined height. Further, in the extraction of the substrate height signal, the two-value two-dimensional pattern signal is utilized as a gate signal. The two-value three-dimensional pattern signal is applied to a three-dimensional pattern inspection logical circuit (3D PAT. INSP. LOGIC) 121, and defects of the wiring pattern are detected. An inspection logic similar to the two-dimensional inspection logic, or the like can be used as the three dimensional pattern inspection logic. In addition, when the slice level is generated, instead of the addition of the above constant signal, a signal having a value determined by a function of the substrate height signal and the constant signal may be applied.

An information (defective position, etc.) relating to defects detected by using the two-dimensional pattern inspection logic and the three-dimensional pattern inspection logic is output from a defect output device 124. A system controller 123 controls the apparatus as a whole, and 125 is a stage controller.

Below, embodiments of the present invention are explained with reference to the drawings.

Figure 7:
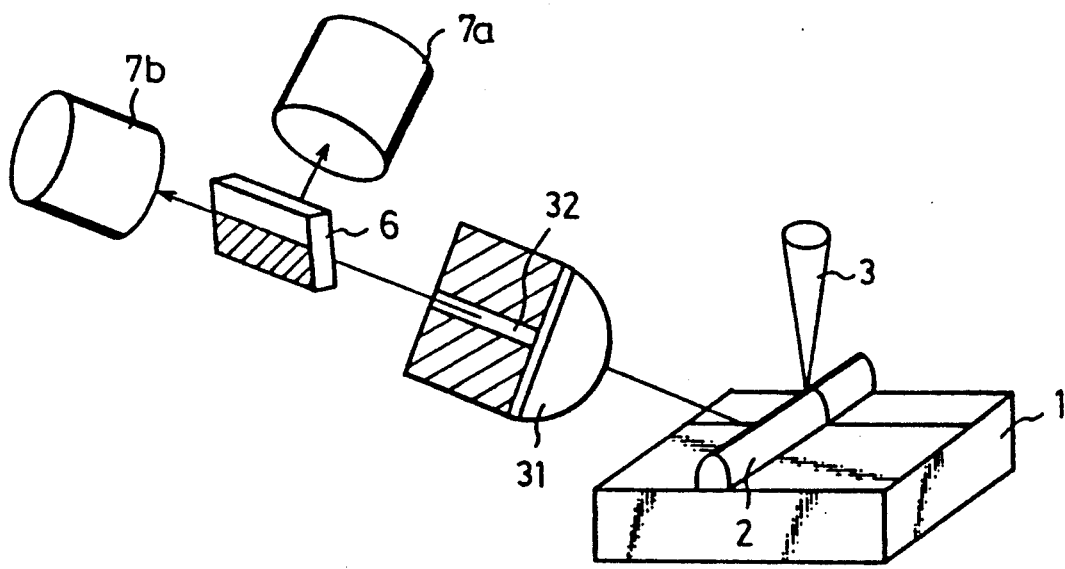
FIG. 7 is a perspective view of an apparatus according to a first embodiment of the present invention.
Figure 8:
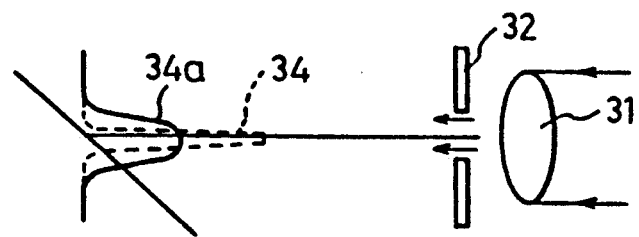
FIG. 8 is an explanatory diagram of the embodiment of FIG. 7.
Figure 9:
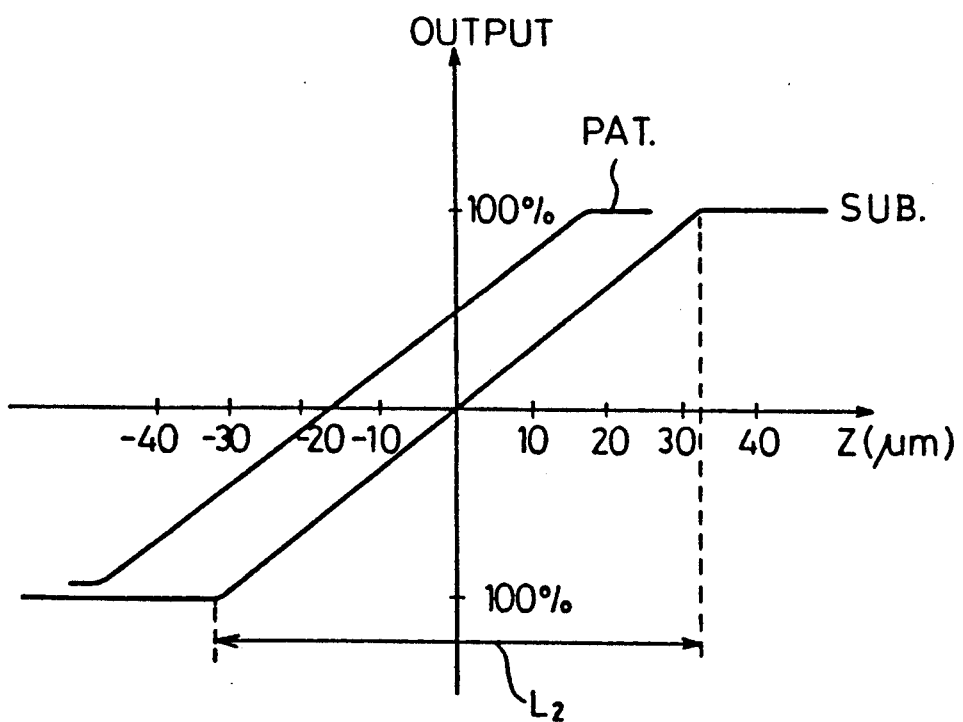
FIG. 9 is a graph explaining a relationship between the pattern height and the output of the differential amplifier.

An apparatus for executing a first embodiment of the present invention is explained below with reference to FIG. 7, FIG. 8, and FIG. 9. In FIGS. 7 to 9, identical reference numerals are used to show portions identical to or corresponding with those shown in FIGS. 1 to 4.

FIG. 7 is a partial perspective view of the apparatus. This apparatus further comprises a lens 31 and slit 32 not included in the apparatus in FIG. 1.

In the method of detection of this embodiment a depth of focus is expanded by enlarging the image of the light beam 3 reflected from the wiring pattern 2.

In this embodiment, as shown in FIG. 8, the image 34 is made vague, as in the image 34a, and the measurable domain of the height of the wiring pattern can be considerably expanded as shown by $L_2$ of FIG. 9, when compared with $L_1$ of FIG. 5. At this point, FIG. 9 is a graph explaining a relationship between the pattern height Z and the output of the differential amplifier. The enlargement of the image 34 to the vague image 34a is accomplished by the providing a slit 32 at an appropriate position from the lens 31, as shown in FIG. 7 and FIG. 8. That is, because the image 34 is proportional to the focal length of the lens 31 divided by the thickness of the slit 32, the light image is blur-focused by reducing the thickness of the slit 32. The reference symbols used in FIG. 9 are the same as used in FIG. 5.

Figure 10:
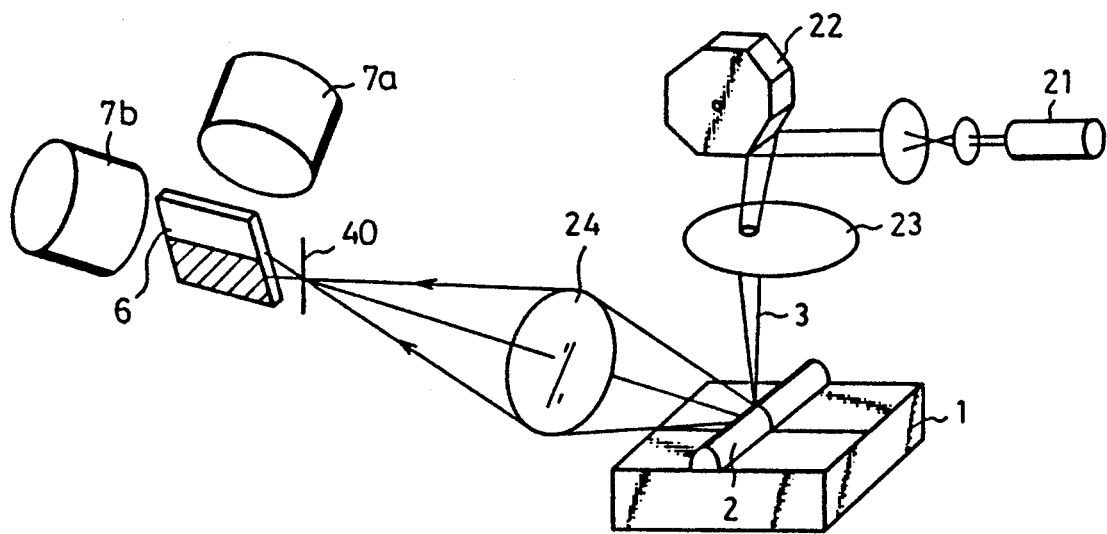
FIG. 10 is a perspective view of a second embodiment of the present invention.

The second embodiment is explained below with reference to FIG. 10. This embodiment does not use the slit 32 to vaguely enlarge the image 34, but instead, the position of the beam-splitter 6 is moved appropriately from the focus plane 40 of the focusing lens 24. Since the light beam is converged at the focus plane 40, the diameter of the image 34 is at a minimum at the focus plane 40. Hence, for example, to enlarge the image 34, the beam-splitter 6 is moved away from the focus plane 40. The remaining details are the same as those of the first embodiment.

In the methods of the first and second embodiments, the measurable height domain of the wiring pattern is expanded by vaguely enlarging the detected image.

Figure 11:
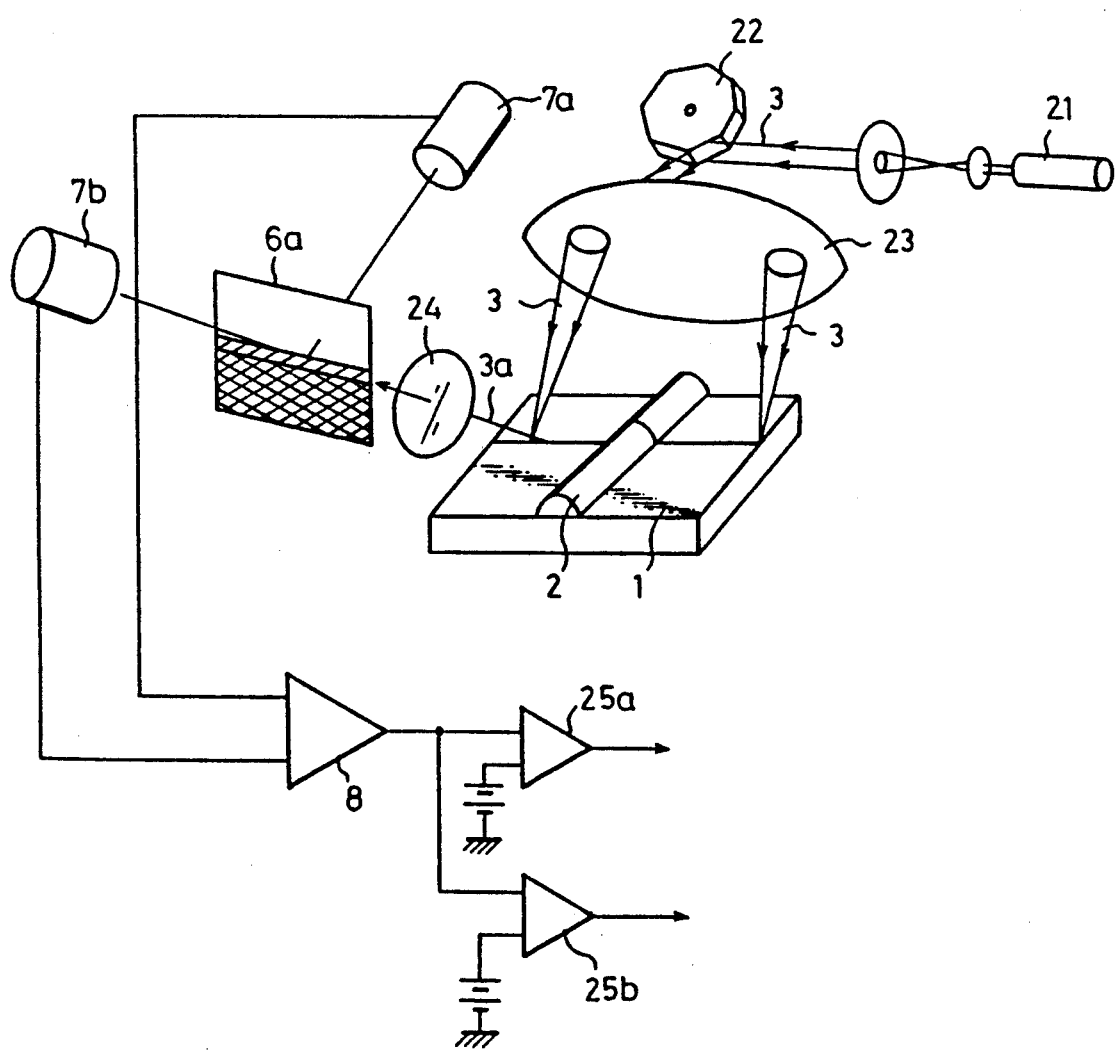
FIG. 11 is a perspective view of an apparatus for a detection of a wiring pattern according to a third embodiment of the present invention.
Figure 12:
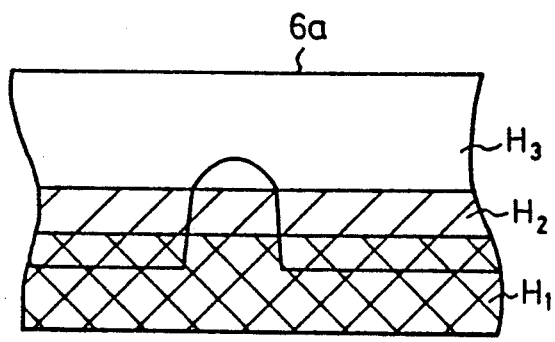
FIG. 12 is a partial plan view of a beam-splitter of the apparatus of FIG. 11.
Figure 13:
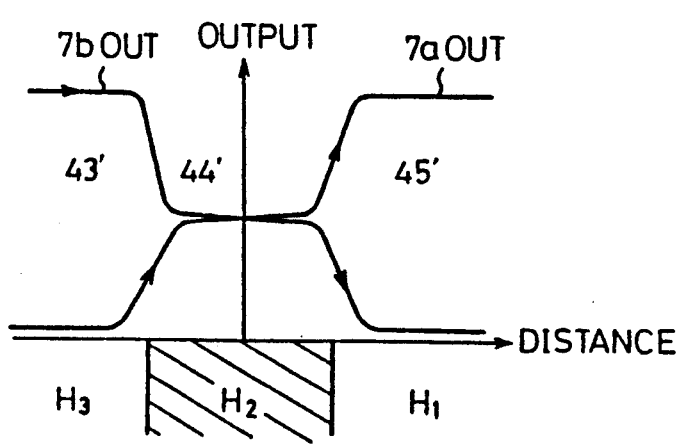
FIG. 13 is a graph of outputs of optical sensors of FIG. 11.
Figure 14:
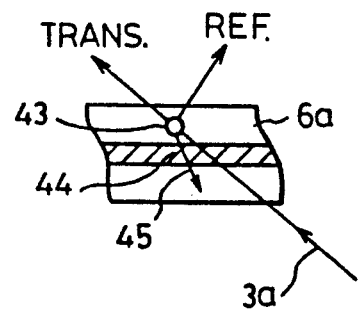
FIG. 14 is a diagram explaining a relationship between an incident reflected light beam and the beam-splitter in connection with FIG. 13.
Figure 15:
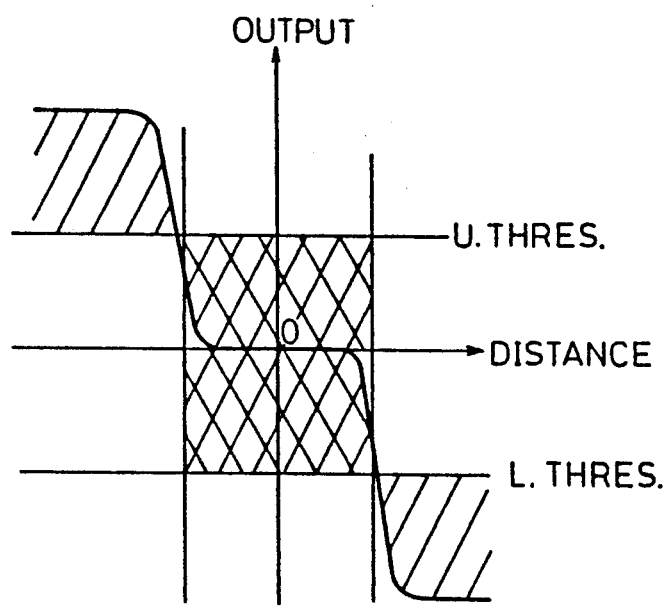
FIG. 15 is a graph explaining a relationship among a differential amplifier output, positions on the beam-splitter, and upper and lower threshold values in the embodiment of FIG. 11.
Figure 16:
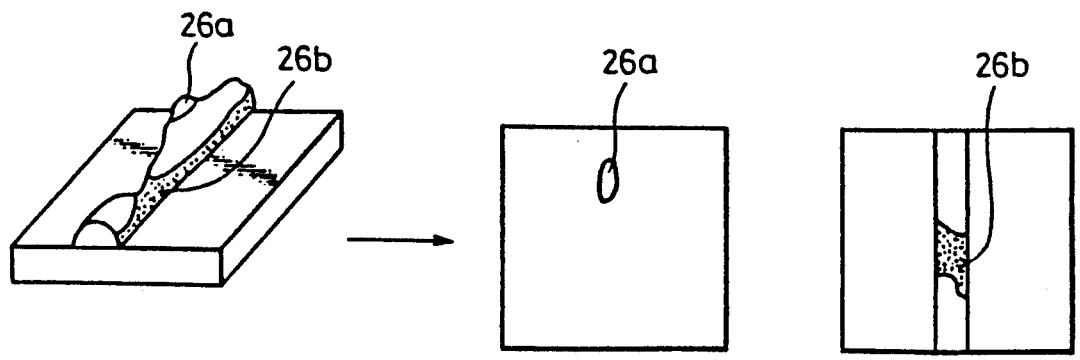
FIG. 16 is a diagram explaining pattern configurations higher than an upper threshold value and lower than a lower threshold value, in an example using the embodiment of FIG. 11.

FIG. 11 is a perspective view of an apparatus for executing the method of detection of a wiring pattern according to a third embodiment of the present invention; FIG. 12 shows the details of a beam-splitter in the apparatus of FIG. 11; FIG. 13 and FIG. 14 are diagrams explaining a relationship between the position of a light in the beam-splitter and a detected output; FIG. 15 is a diagram explaining a relationship between the position in the beam-splitter and an output of a differential amplifier; and FIG. 16 is a diagram explaining a pattern configuration higher than an upper threshold and a pattern configuration lower than a lower threshold.

In the figures, the same reference numerals are used for portions identical to or corresponding with those of FIGS. 1 to 3, except that 3a is a reflected light, and 6a is a beam-splitter having three different areas, i.e., a 100% reflection area $H_1$, a 50% reflection and 50% transmission area $H_2$, and a 100% transmission area $H_3$; 21 is a light source generating, e.g., a laser light, 22 is a rotating mirror, 23 is a scanning lens, 24 is a focusing lens, 25a and 25b are comparators, 26a is a pattern having a height higher than the upper threshold value, and 26b is a pattern having a height lower than the lower threshold value.

An object to be detected comprises a substrate 1 and a wiring pattern 2. The rotating mirror 22 and the scanning lens 23 scan a light beam 3 from the light source 21 and the focusing lens 24 focuses the reflected light 3a from the object. The beam-splitter 6a is located on a focusing plane of the focusing lens 24. At this point, a width of the area $H_2$ having a medium (50% in this apparatus) reflecting in the beam-splitter 6a corresponds to a difference between the upper and lower thresholds, i.e., allowable limits of the wiring pattern thickness. As an example, the beam-splitter 6a can be formed on a substrate of transparent glass where aluminum or the like is evaporated onto the upper portion. The aluminum portions reflect light. Thus, a half transparent and half reflective surface is made and limited by the amount of the evaporation of the aluminum or the like from the upper portion.

Now, the method of detection of a wiring pattern is explained.

As shown in FIG. 11, the light beam 3 from the light source 21 is scanned through the rotating mirror 22 and the scanning lens 23 and is incident on the object to be scanned, i.e., the wiring pattern 2 on the substrate 1. The reflected light 3a from the object is detected and focused through the focusing lens 24, and the focused image is obtained in the beam-splitter 6a. The lights reflected or transmitted by the beam-splitter 6a are detected by the optional sensors 7a or 7b and supplied to input terminals of a differential amplifier 8, and an output of the differential amplifier 8 is supplied to comparators 25a and 25b and is compared with the upper threshold value and the lower threshold value, respectively. A pattern 26a higher than the upper threshold and a pattern 26b lower than the lower threshold are obtained from two-value outputs of the comparators, 25a and 25b, as shown in FIG. 16.

As concretely shown in FIG. 13 and FIG. 14, when the reflected light 3a moves from a point 43 through a point 44 to a point 45 in the beam-splitter 6a, the detection signals of the reflected light 3a obtained by the optical sensors 7a and 7b change along curves from a portion 43' through a portion 44' to a portion 45', respectively. Then, the differential amplifier 8 operates on the outputs of the optical sensors 7a and 7b, and as shown in FIG. 15, steep changes of the light outputs are obtained by the movement of the light beam in the beam-splitter 6a. Slice levels which correspond to upper and lower threshold values are determined in relation to the steep change curve, and the height of the wiring pattern 2 can be determined relative to the upper and lower limits.

Namely, in the above embodiment, the beam-splitter 6a having three different reflectivities is used and the width of the area $H_2$ having a medium (e.g. 50%) reflectivity in the beam-splitter corresponds to the height difference between the upper threshold and the lower threshold of the wiring pattern 2, and thus the thickness of the wiring pattern can be accurately determined to be within or not within the allowable limits of the upper and lower thresholds.

The above-mentioned output of the differential amplifier 8 in FIG. 1 shows a value in the direction of the height of the wiring pattern, and this value can be sliced by the upper and lower limit values of the height of the wiring pattern, whereby patterns outside the limits can be obtained. The problems arising in this case are explained with reference to FIG. 17 and FIG. 18.

Figure 17:
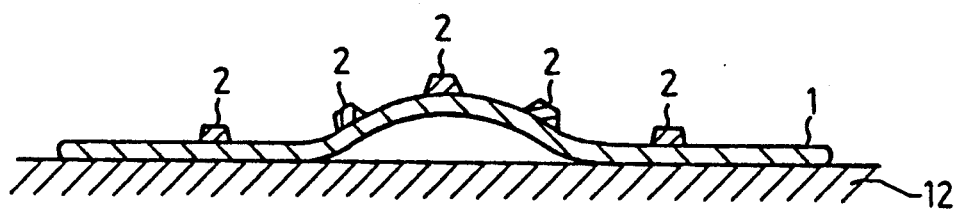
FIG. 17 is a sectional view of an example of a curved substrate with wiring patterns.
Figure 18:
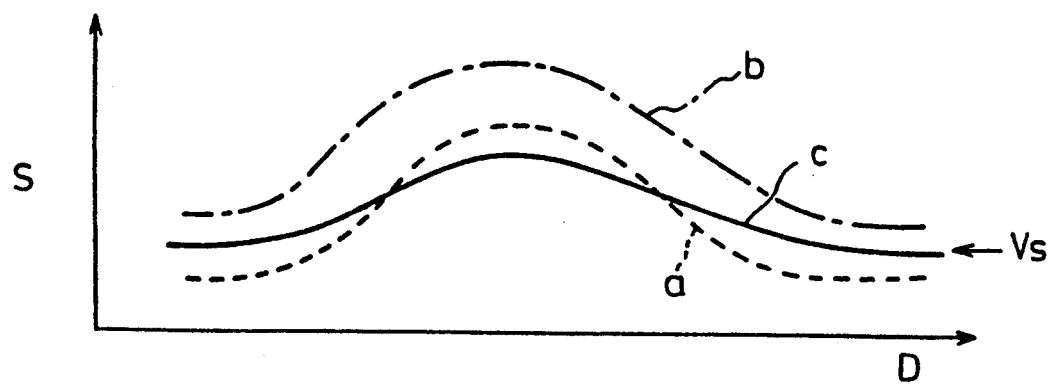
FIG. 18 is a graph explaining a problem of the curved substrate of FIG. 17.

Generally, laser light reflected from a surface of the substrate having a metal wiring formed pattern thereon is not uniform, due to the difference in the scatter characteristics of the substrate 1 and the wiring pattern 2. Namely, when a curved object as shown in FIG. 17 is detected by using this detection apparatus, the outputs S obtained are as shown in FIG. 18. In FIG. 18, a broken line a corresponds to the actual surface of the substrate 1, a dot-and-dash line b is an envelope line of a plurality of wiring patterns 2, and a solid line c shows an output voltage (Vs) corresponding to the surface of the substrate 1. The abscissa shows a distance D.

The broken line a should coincide with the solid line c, but sometimes a non-coincidence thereof occurs as explained below. Namely, the substrate 1 has a light transmission characteristic, and the laser light incident on the substrate 1 penetrates the substrate 1 and is diffused therein, and thus the spot diameter of the laser light on the surface of the substrate 1 is expanded. On the other hand, the wiring pattern 2 does not have a transmission characteristic, and therefore, the spot diameter of the laser light is not expanded but remains as a fine spot diameter. The laser lights having different diffusion characteristics are reflected from the substrate 1 and the wiring pattern 2 into the beam-splitter 6, and the light reflected from the substrate 1 becomes an expanded spot and the light reflected from the wiring pattern 2 becomes a fine spot. The output voltage of the detection apparatus is changed in response to the focused position of the laser lights having the two spot diameters, and the detection apparatus responds accurately to the fine spot but inaccurately to the expanded spot, and therefore, the Vs (solid line c) obtained from the expanded spot becomes smaller than the actual curve of the substrate. On the other hand, the dot-and-dash line b obtained from the fine spot corresponds to the actual height of the surface of the wiring pattern 2. As a result, if a slice level is determined by an addition of the Vs which is not equal to the actual value and a predetermined constant value, the slice level is too low in the center of the curve of the substrate 1 and too high in the portion thereof not having a curve. Particularly, if the slice level is too high, sometimes the slice level is higher than the surface level of the wiring pattern 2, and in this case, the detection of the wiring pattern cannot be made.

An apparatus using a method of detection of a wiring pattern according to a fourth embodiment of the present invention is explained with reference to FIG. 19, FIG. 20, and FIG. 21.

Figure 19:
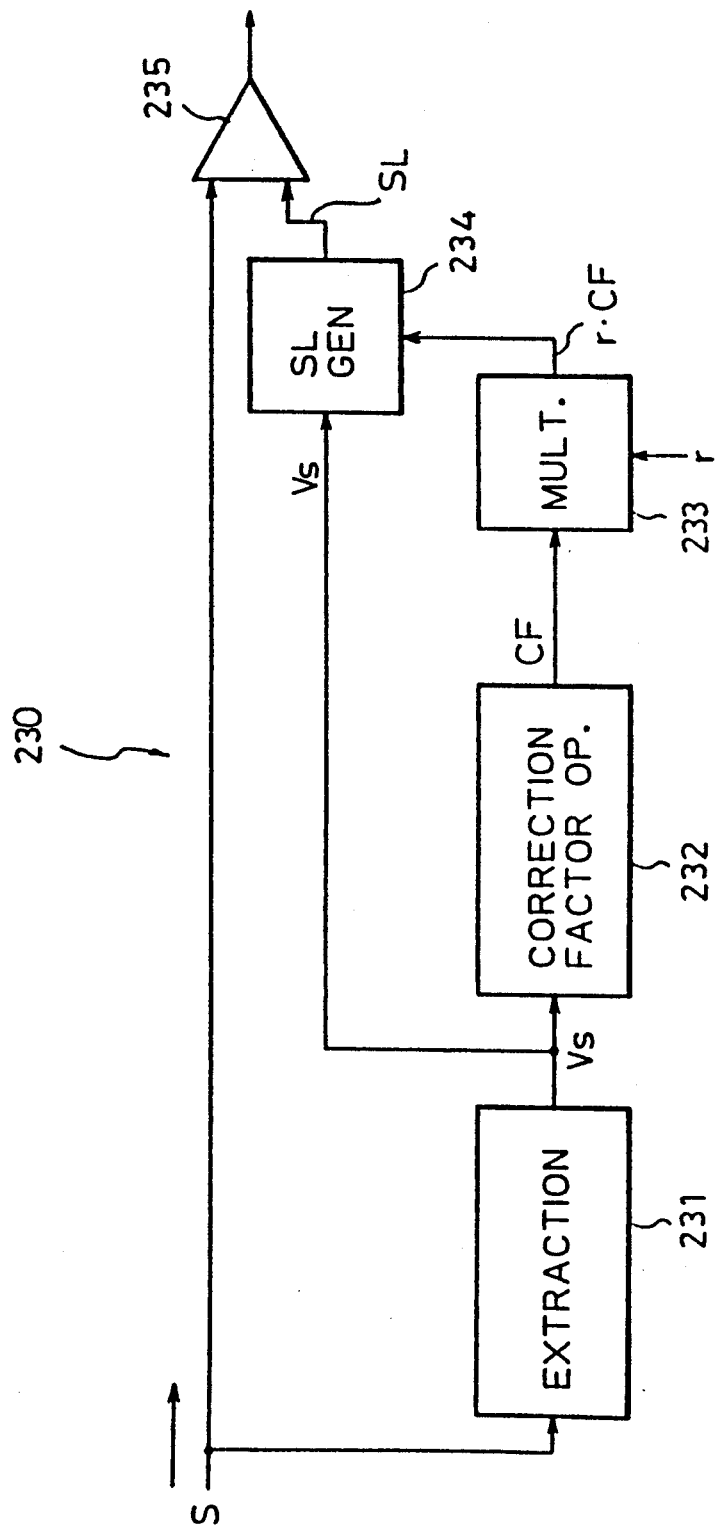
FIG. 19 is a partial block circuit diagram of a fourth embodiment of the present invention.

FIG. 19, shows a partial block circuit diagram of the apparatus. In this figure, only portions different from those used for the above first to third embodiments are shown. This apparatus is advantageous when the substrate is curved.

FIG. 19 is a block circuit diagram of a comparison circuit 230 which corresponds to the comparator 25a or 25b in FIG. 11. The comparison circuit 230 comprises an extraction section 231 for extracting a level Vs of the substrate 1 from a three dimensional pattern detection signal S which is an output of the differential amplifier 8, a correction factor operation section 232 for calculating a correction factor CF from the Vs and outputting the CF, a multiplication section (MULT) 233 for operating a product of a constant voltage r corresponding to the upper or the lower threshold in the input of the comparator 25a or 25b and the output of the correction factor operation section 232, a slice level generation section 234 for adding the output of the multiplication section (r.CF) to the Vs and generating a slice level SL, and a comparison section 235 for comparing the SL with the S and obtaining a two-value signal. The two-value signal obtained by the comparison section 235 is supplied to a pattern determination apparatus (not shown) as an inspection wiring pattern signal.

Figure 20:
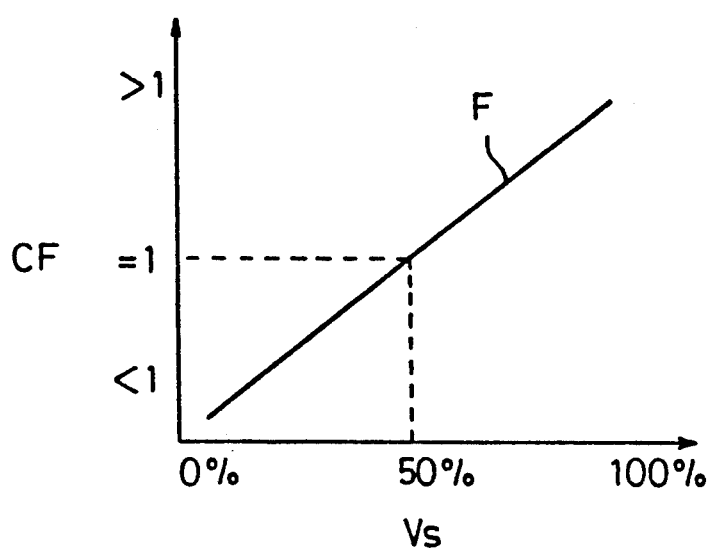
FIG. 20 is a graph explaining a relationship between a substrate level and a correction factor.
Figure 21:
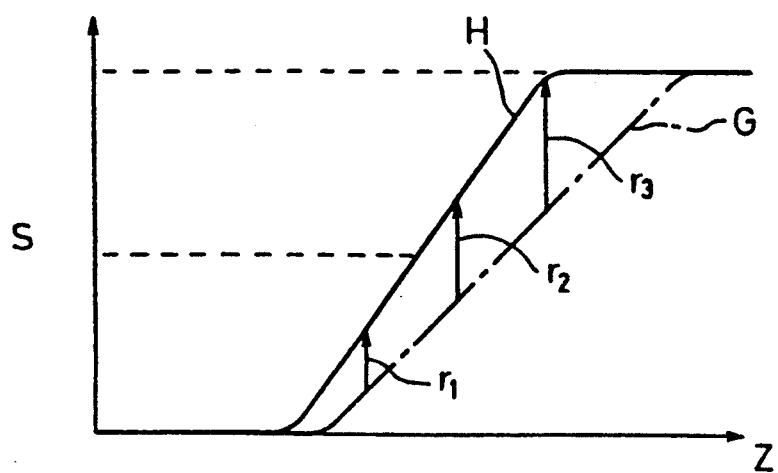
FIG. 21 is a graph explaining a relationship between a mounting level and a three-dimensional pattern detection signal in the method of FIG. 19.

FIG. 20 is a graph explaining a relationship between the Vs and the CF operated by the correction factor operation section 232. In FIG. 20, the abscissa shows a relative value of the Vs, i.e., the substrate level including the curvature, and corresponds to a relationship between the outputs of the optical sensors 7a and 7b. Concretely, at 0%, the output of the sensor 7a is maximum and the output of the sensor 7b is minimum, at 50% both outputs are the same, and at 100% the output of the sensor 7a is minimum and the output of the sensor 7b is maximum. The ordinate shows the correction factor CF wherein at about 50% of the Vs, CF =1, at 50% to 100% of the Vs, CF>1, and at 0% to 50% of the Vs, CF<1. In this graph, the line F showing a change of the CF increases in accordance with the increase of the Vs. Namely, at 50 to 100% of Vs, the CF becomes greater than 1. This means that the slice level SL is large in the middle of the curvature, and as a result, the appropriate correction of the SL can be carried out in the vicinity of the center of the curvature. Where the Vs is from 0% to 50%, the CF is less than 1, and thus, if there is no curvature of the substrate, the smaller SL is appropriately determined.

In this embodiment, the correction factor CF is determined in accordance with the level of the surface of the substrate 1, and the slice level is corrected using the CF, and as a result, the slice level is optimized at the center or non-curved portions, and a sectional configuration of the wiring pattern 2 can be accurately patterned by, e.g., using the two-value method. Accordingly, the inspection of the wiring configuration can be carried out with a high reliability.

Further, the CF determination is preferably carried out as followed. For example, the object on which a wiring pattern having no defects is formed is put on a stage 12, and the S's of the substrate 1 and the wiring pattern 2 are plotted in response to the change of the height at which the object is mounted. Then, for example, a graph shown in FIG. 21 is obtained. In FIG. 21, the abscissa shows a height at which the object is mounted, and the ordinate shows the value of S. The dot-and-dash line G is a plotting result of the substrate 1, and the solid line H is a plotting result of the wiring pattern 2.

The solid line H accurately follows the change of the height of the wiring pattern 2, but the dot-and-dash line G cannot be obtained with a comparatively good response to the change of the height of the substrate 1. Accordingly, differences between the lines G and H are obtained, for example, at three points, i.e., $r_1$, $r_2$, and $r_3$. The number of points is not limited to three. The CF value may be determined based on the obtained differences at the points $r_1$, $r_2$, and $r_3$. Namely, the difference at $r_1$ is smaller than that at $r_2$, and the difference at $r_2$ is smaller than that at $r_3$, and as a result, the line F in FIG. 20 is obtained. Note, the line F is sometimes considered to be a curve instead of a straight line.

In this embodiment, the signal output from the height measuring apparatus which measures the heights from the stage to the surface of the substrate and from the stage to the surface of the wiring pattern formed on the substrate is compared with the slice level based on the height of the surface of the substrate, and it is determined whether the formation of the wiring pattern is within allowable limits. Further, when the slice level is determined, where the height of the substrate is high, the slice level is made high, and where the height of the substrate is low, the slice level is made low, by using a correction factor.

In this embodiment, as mentioned above, the slice level is corrected in response to the height of the surface of the substrate. Therefore, in the case of an inspection of a wiring pattern on a curved substrate, the slice level becomes high in the vicinity of the center of the curved portion of the substrate, and at a non-curved portion of the substrate, the slice level becomes low, and thus even a wiring pattern sectional configuration on a curved substrate can be accurately detected.

We claim:

1. A method of a detection of a wiring pattern using a triangulation method to detect a height thereof, comprising steps of:
    illuminating a wiring pattern to be detected on a substrate by a scanned light beam from a light source;
    blur-focusing light reflected from the wiring pattern and the substrate through a focusing lens at a focal point of the focusing lens;
    separating the blur-focused reflected light into reflected light and transmitted light, each light having a different direction, through a beam-splitter, entered by the blur-focused reflected light;
    detecting the separated reflected light and transmitted light using optical sensors, respectively;
    measuring a difference in light intensity of the reflected light and the transmitted light; and
    determining from the measured difference an upper threshold value and a lower threshold value relative to a height of the wiring pattern.

2. A method of detection of a wiring pattern as set forth in claim 1, wherein the blur-focusing is accomplished by providing a slit after the focusing lens.

3. A method of detection of a wiring pattern as set forth in claim 2, wherein the method further comprises the step of comparing a measured difference between the reflected light and the transmitted light with a predetermined fixed upper threshold level and a predetermined fixed lower threshold level to display out-of-standard portions.

4. A method of detection of a wiring pattern as set forth in claim 3, wherein one of the upper and lower threshold levels is corrected by a modifying factor which makes the threshold level high when a height of a substrate of the wiring pattern is high and makes the threshold level low when a height of the substrate is low.

5. A method of detection of a wiring pattern as set forth in claim 1, wherein the blur-focusing is accomplished by deviating a position of the beam-splitter from the focal point of the focusing lens.

6. A method of detection of a wiring pattern as set forth in claim 3, wherein the method further comprises the step of comparing a measured difference between the reflected light and the transmitted light with a predetermined fixed upper threshold level and a predetermined fixed lower threshold level to display out-of-standard portions.

7. A method of detection of a wiring pattern as set forth in claim 3, wherein the method further comprises the step of comparing a measured difference between the reflected light and the transmitted light with a predetermined fixed upper threshold level and a predetermined fixed lower threshold level to display out-of-standard portions.

8. A method of detection of a wiring pattern using a triangulation method to detect a height thereof, comprising steps of:
   scanning a light beam from a light source through a rotating polygon mirror and a scanning lens;
   illuminating a wiring pattern to be detected on a substrate by the scanned light beam;
   focusing light reflected from the wiring pattern and the substrate through a focusing lens at a focal point of the focusing lens;
   separating the focused reflected light into reflected light and transmitted light, each light having a different direction, through a beam-splitter having a substantially complete reflection portion, a medium reflection and medium transmission portion, and a substantially complete transmission portion entered by the focused reflected light;
   detecting the separated reflected light and transmitted light using optical sensors, respectively;
   measuring a difference in intensity of the reflected light and the transmitted light; and
   determining from the measured difference an upper threshold value and a lower threshold value relative to a height of the wiring pattern as values corresponding to a width of an area having a medium reflecting in the beam-splitter.

9. An apparatus for detection of a wiring pattern using a triangulation method to detect a height thereof, comprising:
   a focusing lens receiving a light beam reflected from a wiring pattern and a substrate thereof, which are illuminated by a scanned light beam, and for blur-focusing the reflected light beam;
   a beam splitter receiving the light beam from the focusing lens, and for outputting a reflected light beam and a transmitted light beam separately, the intensities of which correspond to a configuration of the wiring pattern;
   two optical sensors for receiving the reflected light beam and the transmitted light beam, respectively, from the beam-splitter; and
   a differential amplifier for determining the difference between outputs of the two optical sensors, to obtain upper and lower threshold values corresponding to upper and lower allowable limits of the wiring pattern height.

10. An apparatus for detection of a wiring pattern as set forth in claim 9 further comprising a slit after the focusing lens to widen the reflected light beam through the focused lens.

11. An apparatus for detection of a wiring pattern as set forth in claim 10, wherein the apparatus further comprises:
   a first comparator for receiving an output of the differential amplifier, and for comparing the output of the differential amplifier with a predetermined fixed upper threshold level; and
   a second comparator for receiving an output of the differential amplifier, and for comparing the output of the differential amplifier with a predetermined fixed lower threshold level.

12. An apparatus for detection of a wiring pattern as set forth in claim 10, wherein the apparatus further comprises:
   an extraction section receiving the output of the differential amplifier and extracting a substrate level;
   a correction factor operation section, receiving an output of the extraction section, for operating a correction factor which increases in accordance with an increase of the substrate level; and
   a slice level determination section receiving the outputs of the extraction section and the correction factor operation section and for determining a slice level for one of the first and second comparators.

13. An apparatus for detection of a wiring pattern as set forth in claim 7, wherein the beam-splitter is located apart from the focal point of the focusing lens.

14. An apparatus for detection of a wiring pattern as set forth in claim 9, wherein the apparatus further comprises:
   a first comparator for receiving an output of the differential amplifier, and for comparing the output of the differential amplifier with a predetermined fixed upper threshold level; and
   a second comparator for receiving an output of the differential amplifier, and for comparing the output of the differential amplifier with a predetermined fixed lower threshold level.

15. An apparatus for detection of a wiring pattern as set forth in claim 13, wherein the apparatus further comprises:
   an extraction section receiving the output of the differential amplifier and extracting a substrate level;
   a correction factor operation section, receiving an output of the extraction section, for operating a correction factor which increases in accordance with an increase of the substrate level; and
   a slice level determination section receiving the outputs of the extraction section and the correction factor operation section and for determining a slice level for one of the firs and second comparators.

16. An apparatus for detection of a wiring pattern using a triangulation method to detect a height thereof, comprising:
   a light source for projecting a light beam;
   a rotating polygon mirror and a scanning lens for scanning the light beam on a wiring pattern;
   a focusing lens receiving a light beam reflected from the wiring pattern and a substrate thereof and focusing the reflected light beam;
   a beam-splitter having three areas, one of which reflects an incident light beam, another of which reflects substantially half and transmits substantially half, and the other of which transmits the incident light beam, for receiving the light beam from the focusing lens, and for outputting a reflected light beam and a transmitted light beam separately, at intensities which correspond to a configuration of the wiring pattern;
   two optical sensors for receiving the reflected light beam and the transmitted light beam, respectively, from the beam-splitter; and a differential amplifier for operating the difference between outputs of the two optical sensors so that upper and lower threshold values corresponding to upper and lower allowable limits of the wiring pattern height are determined;

wherein each of the three areas of the beam-splitter has a width and the width of the area of the beam-splitter which reflects substantially half and transmits substantially half the light beam correspond to a dimension between the upper and lower limits of the wiring pattern height.

* * * * *